United States Patent
Ajit

(10) Patent No.: US 6,844,755 B2
(45) Date of Patent: Jan. 18, 2005

(54) METHODS AND SYSTEMS FOR SENSING AND COMPENSATING FOR PROCESS, VOLTAGE, TEMPERATURE, AND LOAD VARIATIONS

(75) Inventor: Janardhanan S. Ajit, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 10/700,443

(22) Filed: Nov. 5, 2003

(65) Prior Publication Data

US 2004/0090240 A1 May 13, 2004

Related U.S. Application Data

(63) Continuation of application No. 10/178,272, filed on Jun. 25, 2002, now Pat. No. 6,670,821.
(60) Provisional application No. 60/343,582, filed on Jan. 2, 2002.

(51) Int. Cl.[7] .............................................. H03K 17/16
(52) U.S. Cl. ............................ 326/32; 326/26; 326/27; 327/170; 327/391
(58) Field of Search ............................. 326/32, 26, 27, 326/30, 82, 83; 327/108–112, 117, 391

(56) References Cited

U.S. PATENT DOCUMENTS

| | | |
|---|---|---|
| 5,719,509 A | 2/1998 | Chan |
| 5,877,647 A | 3/1999 | Vajapey et al. |
| 6,060,907 A | 5/2000 | Vishwanthaiah et al. |
| 6,137,322 A | 10/2000 | Ten Eyck |
| 6,144,218 A | 11/2000 | Smith et al. |
| 6,177,819 B1 | 1/2001 | Nguyen |
| 6,184,730 B1 | 2/2001 | Kwong et al. |
| 6,552,583 B1 | 4/2003 | Kwong |
| 6,583,644 B2 | 6/2003 | Shin |
| 6,670,821 B2 * | 12/2003 | Ajit .............................. 326/32 |
| 2001/0026178 A1 | 10/2001 | Itoh et al. |

FOREIGN PATENT DOCUMENTS

DE 40 18 754 A1 12/1991

OTHER PUBLICATIONS

European Search Report from European Patent Application No. 03250012.6, 4 pages, mailed Mar. 26, 2003.
Choy, C.S. et al., "A Low Power–Noise Output Driver with an Adaptive Characteristic Applicable to a Wide Range of Loading Conditions," *IEEE Journal of Solid–State Circuits*, vol. 32, No. 6, pp. 913–917 (Jun. 1997).
Huchzermeier, J., "Sauber und schnell schalten Dynamic Output Control ermöglicht verbesserte Schalteigenschaften bei hohen Geschwindigkeiten," *Electronik*, vol. 48, N . 20, pp. 50–54, 56 and 58 (Oct. 5, 1999).
*CMOS Integrated Circuits, B–Series*, Solid State Scientific, Inc., pp. 16–17 (Nov. 1976).

* cited by examiner

*Primary Examiner*—Vibol Tan
(74) *Attorney, Agent, or Firm*—Sterne, Kessler, Goldstein & Fox PLLC

(57) ABSTRACT

Methods and systems for maintaining desired circuit and/or signal characteristics, such as impedance matching characteristics and rise and fall time characteristics, over a range of PVT variations. In an embodiment, a PVT compensating circuit senses one or more circuit and/or signal characteristics at an output pad or terminal. When the one or more circuit and/or signal characteristics are affected by PVT variations in the IC and/or load, the PVT compensating circuit controls a variable output drive to maintain the one or more circuit and/or signal characteristics within a desired or predetermined range. The PVT compensating circuit is designed to compensate over a range of PVT variations. In an embodiment, the PVT compensating circuit senses a rate of voltage change over time (i.e., dV/dt), of an output signal at the output terminal. During state transitions of the output signal, the output signal is adjusted as needed to maintain a desired, or pre-determined, rate of voltage change. The invention further provides impedance matching characteristics.

10 Claims, 9 Drawing Sheets

METHODS AND SYSTEMS FOR SENSING AND COMPENSATING FOR PROCESS, VOLTAGE, TEMPERATURE, AND LOAD VARIATIONS

CROSS-REFERENCE TO RELATED APPLICATIONS

This application is a continuation of U.S. application Ser. No. 10/178,272, filed Jun. 25, 2002 U.S. Pat. No. 6,670,821, titled "Methods and Systems for Sensing and Compensating for Process, Voltage, Temperature, and Load Variations," (allowed), which claimed priority to U.S. Provisional Application No. 60/343,582, filed Jan. 2, 2002, titled "Methods and Systems for Sensing and Compensating for Process, Voltage and Temperature Variations," both of which are incorporated herein by reference in their entireties.

BACKGROUND OF THE INVENTION

1. Field of the Invention

The present invention is directed to methods and systems for sensing and compensating for process, voltage, and/or temperature ("PVT") variations in integrated circuits ("ICs") and loads and, more particularly, for sensing and compensating for PVT variations in IC's that are impedance matched to loads.

2. Related Art

Integrated circuits ("ICs") need to interface with widely varying loads, such as 40 ohm to 100 ohm transmission lines. In order to reduce voltage waveform reflections and consequent loss of signal integrity, output impedances of ICs should match load impedances.

IC characteristics and load characteristics can vary due to process (e.g., manufacturing process), voltage, and/or temperature ("PVT") variations. ICs that are fabricated with narrower track widths tend to be more susceptible to PVT variations. PVT variations adversely affect circuit characteristics, such as impedances and rise and fall times of waveforms.

What are needed are methods and systems for maintaining circuit and/or signal characteristics, such as impedance matching characteristics and rise and fall time characteristics, over a range of PVT variations.

SUMMARY OF THE INVENTION

The present invention is directed to methods and systems for maintaining circuit and/or signal characteristics, such as impedance matching characteristics and rise and fall time characteristics, over a range of PVT variations. The invention is useful, for example, where an IC output is coupled to a load.

In accordance with the invention, a PVT compensating circuit senses one or more circuit and/or signal characteristics at an output pad or terminal. When the one or more circuit and/or signal characteristics are affected by PVT variations in the IC and/or load, the PVT compensating circuit controls a variable output drive to maintain the one or more circuit and/or signal characteristics within a desired or predetermined range. The PVT compensating circuit is designed to compensate over a range of PVT variations.

In an embodiment, the PVT compensating circuit senses a rate of voltage change over time (i.e., dV/dt), of an output signal at the output terminal. During state transitions of the output signal, the output signal is adjusted as needed to maintain a desired, or pre-determined, rate of voltage change. As a result, the present invention enables control of output drive dependent on load.

In an embodiment, the PVT compensating circuit and the variable output drive are part of an output circuit coupled between an IC and an output terminal. The output circuit further includes an output impedance. When neither the circuit nor the load are substantially affected by PVT variations, the output impedance substantially matches the load impedance and the output signal characteristic(s) of interest are generally within a desired or predetermined range. When the IC and/or the load are affected by PVT variations, the PVT compensating circuit senses the affect and adjusts the variable output drive to make suitable corrections. In an embodiment, the output drive adjusts rise and/or fall times of an output waveform. Alternatively, or additionally, the variable output drive adjusts the output impedance of the output circuit.

In an embodiment, the output signal is initially driven by a primary output drive. Additional compensation is added as needed by the variable output drive. In an alternative embodiment, output signal is driven solely by the variable output drive circuit.

In an embodiment, the primary output drive and/or the variable output drive include impedances that, alone or in combination with other impedances, substantially match the load impedance.

In an embodiment, the output circuit is implemented on the same die or wafer as the IC. In an embodiment, the output circuit is implemented with process technology that is less susceptible to PVT variations. For example, in an embodiment, one or more portions of the output circuit are implemented using wider path widths than those used in the IC and/or load.

Further features and advantages of the present invention, as well as the structure and operation of various embodiments of the present invention, are described in detail below with reference to the accompanying drawings.

BRIEF DESCRIPTION OF THE DRAWINGS/FIGURES

The present invention will be described with reference to the accompanying drawings, wherein like reference numbers indicate identical or functionally similar elements. Also, the leftmost digit(s) of the reference numbers identify the drawings in which the associated elements are first introduced.

Figure 2:
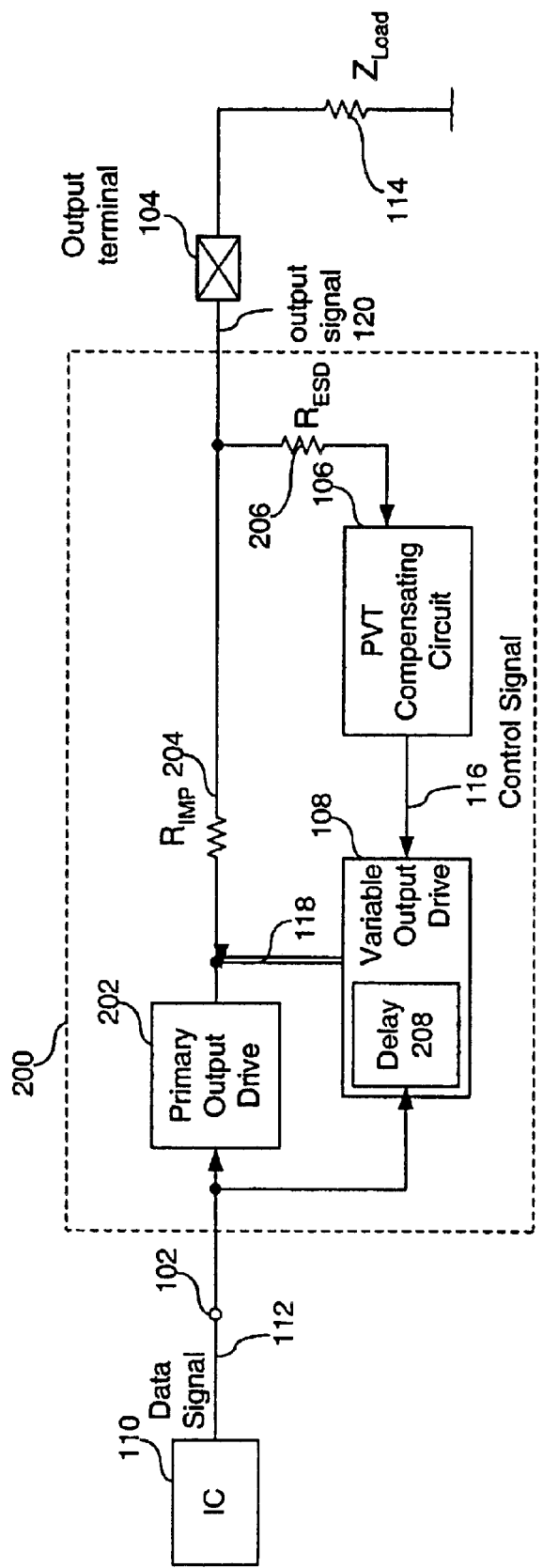
FIG. 2 is a block diagram of an example embodiment of the output circuit illustrated in FIG. 1.
Figure 5:
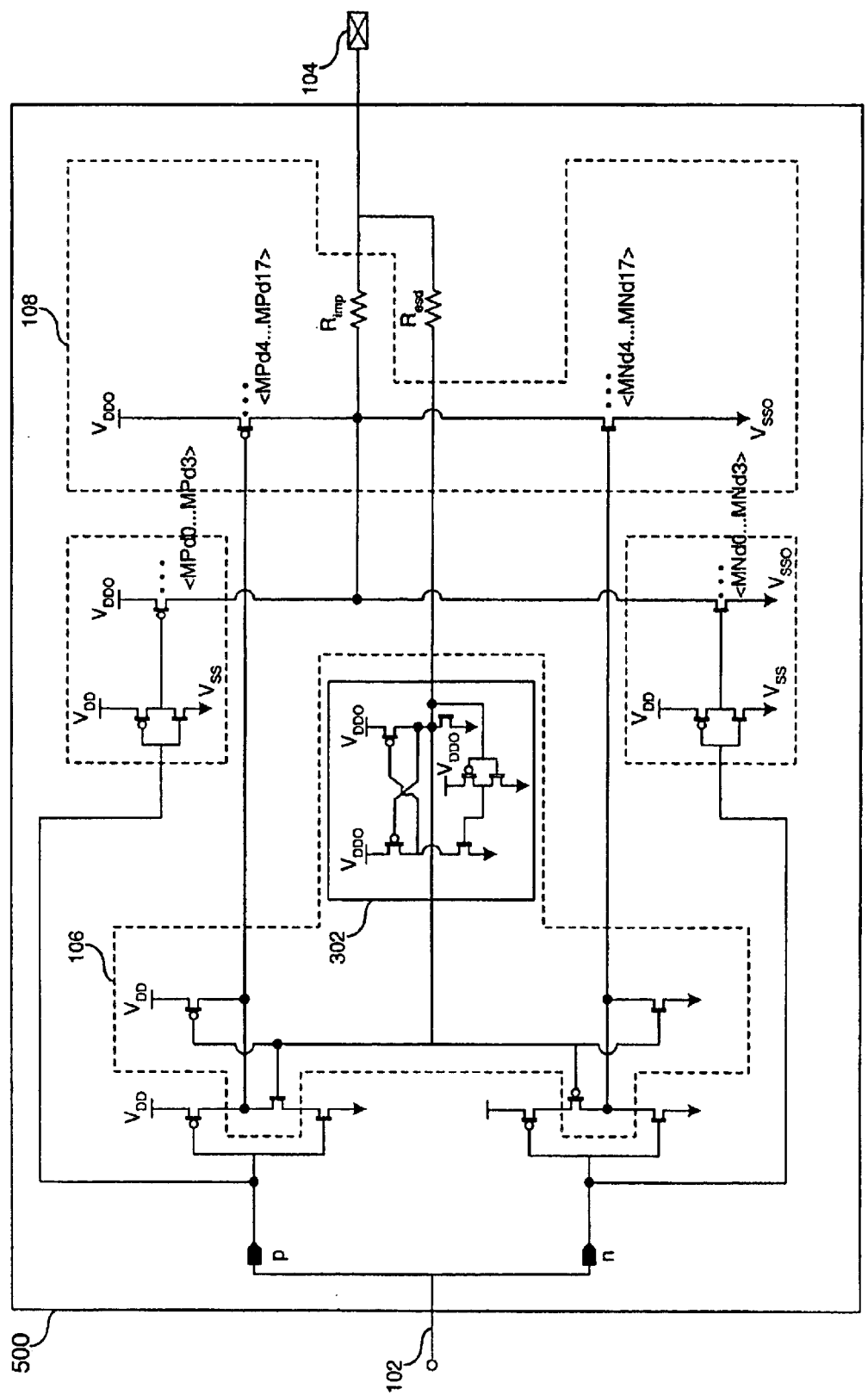

In FIG. 5 is another circuit diagram of an example embodiment of the output circuit illustrated in FIG. 2.

Figure 6:
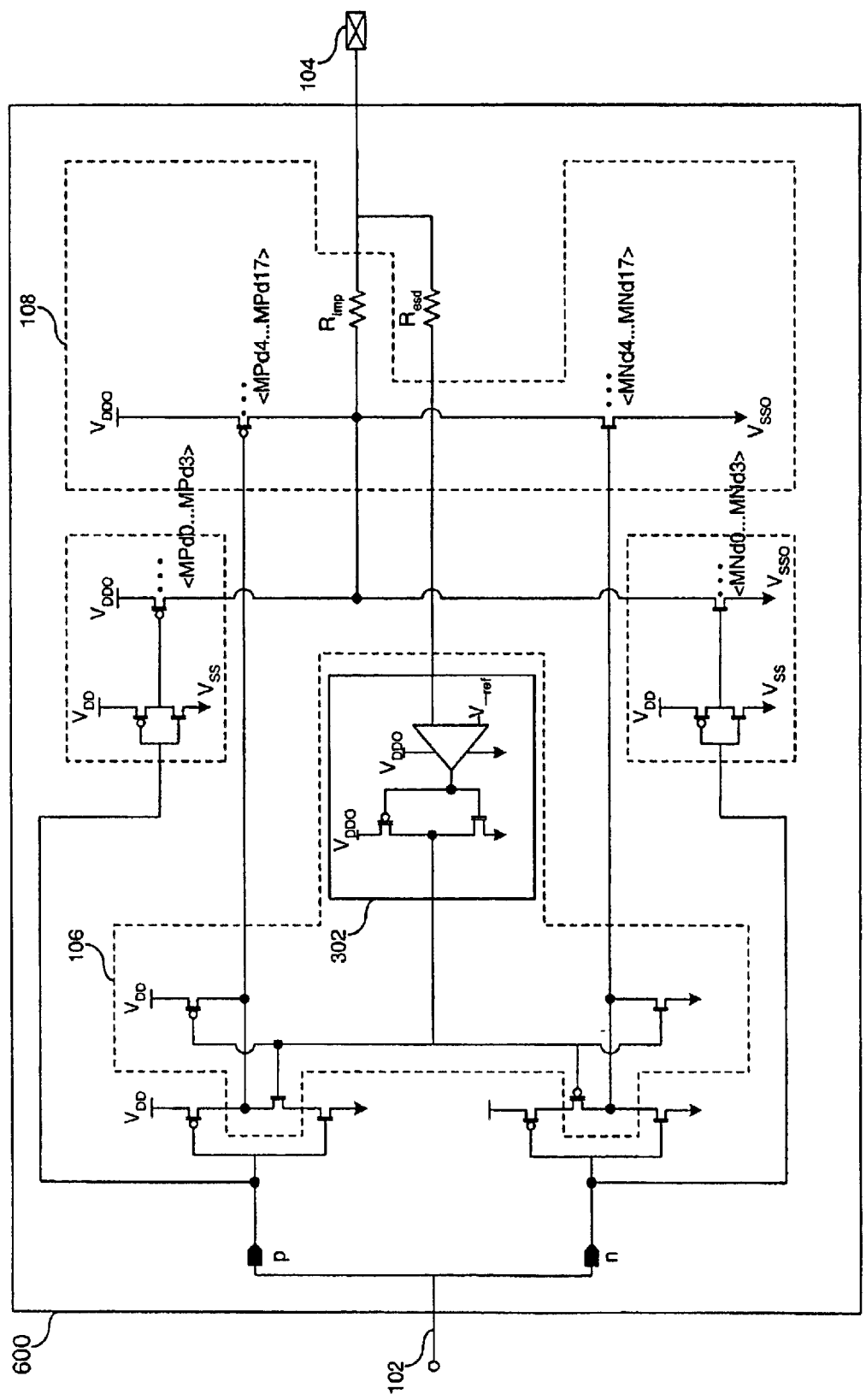

FIG. 6 is another circuit diagram of an example embodiment of the output circuit illustrated in FIG. 2.

Figure 7:
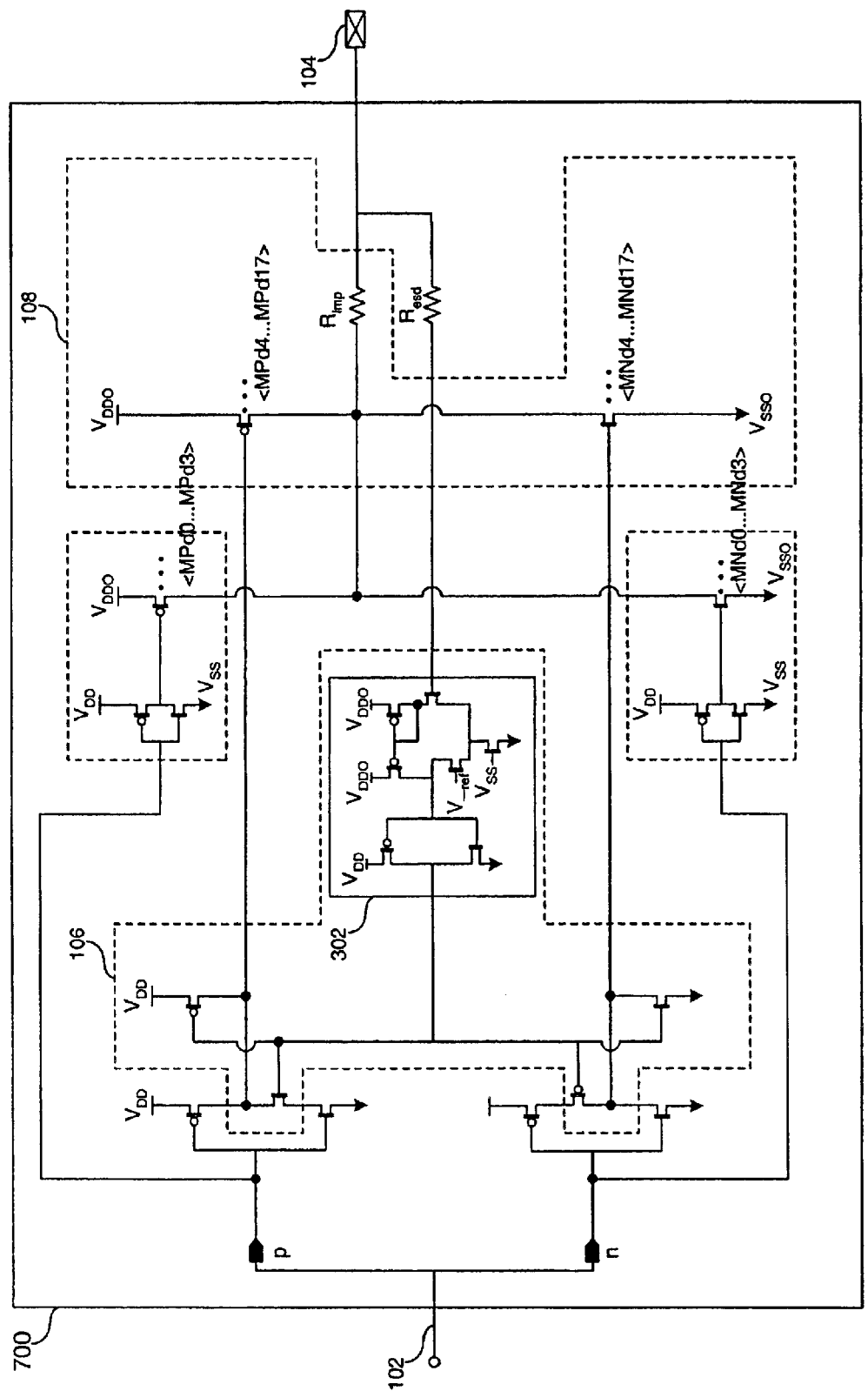

FIG. 7 is another circuit diagram of an example embodiment of the output circuit illustrated in FIG. 2.

Figure 8:
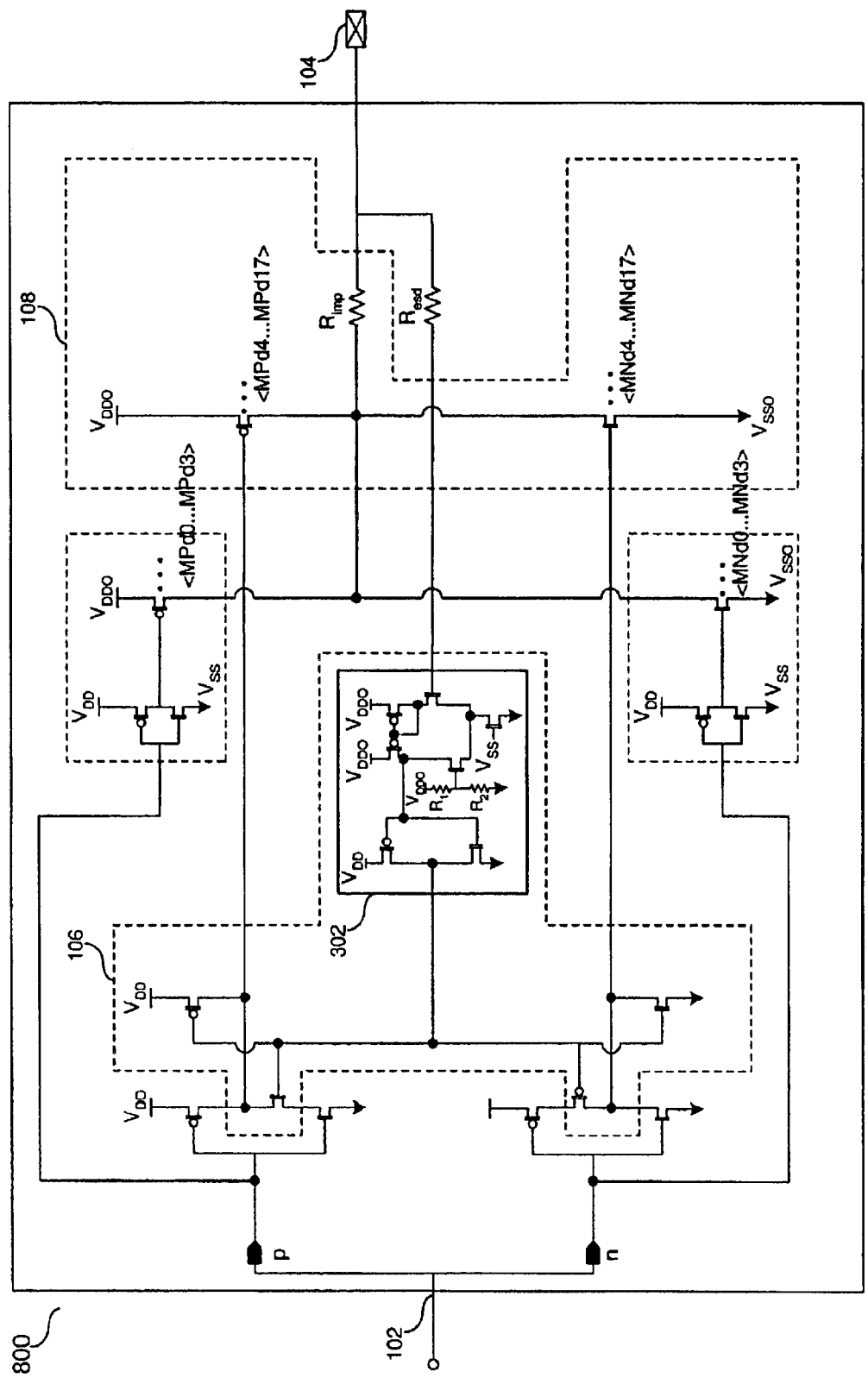

FIG. 8 is another circuit diagram of an example embodiment of the output circuit illustrated in FIG. 2.

Figure 9:
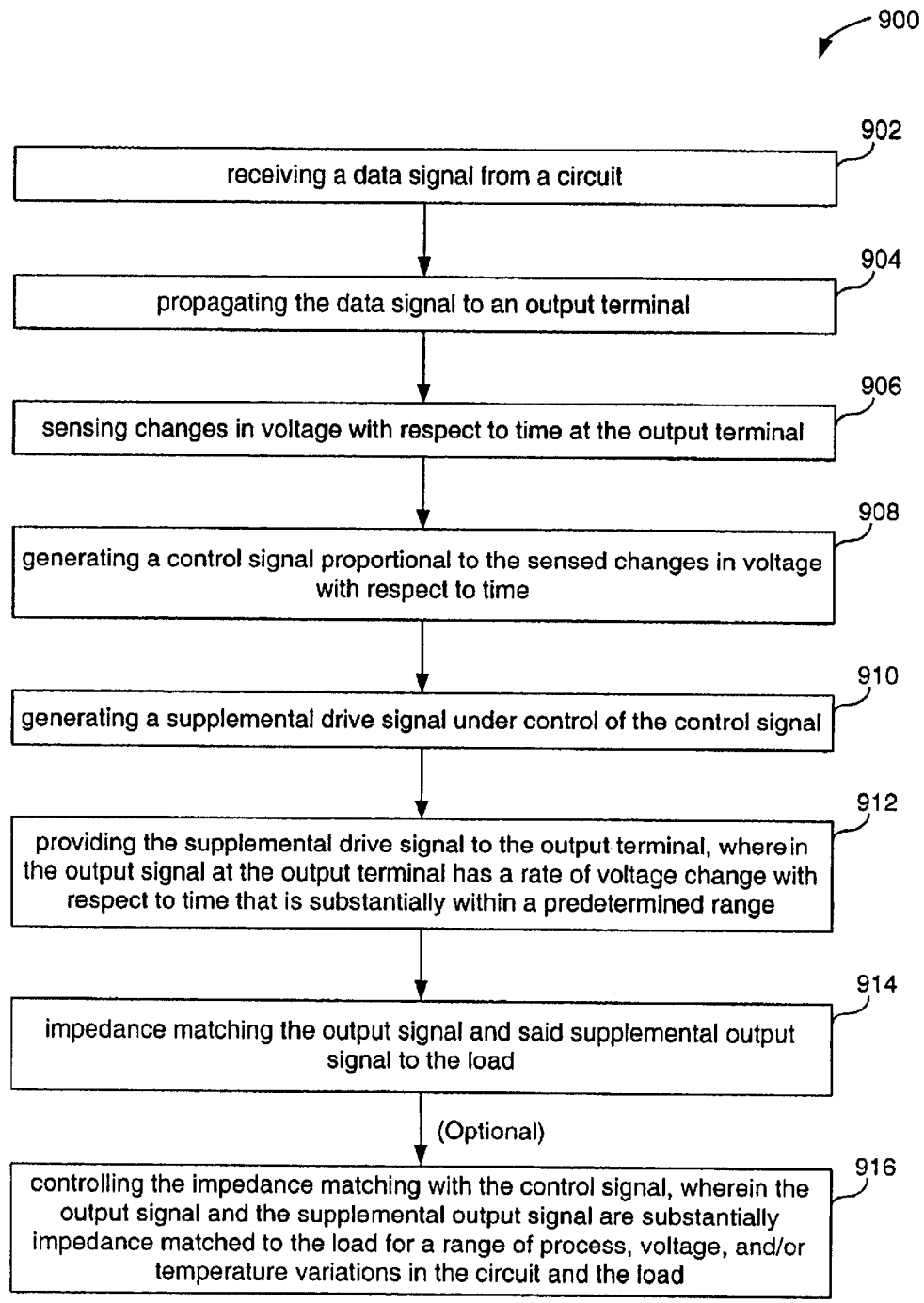

In FIG. 9 is a process flowchart for implementing the present invention.

DETAILED DESCRIPTION OF THE INVENTION

I. Introduction

The present invention is directed to methods and systems for maintaining circuit and/or signal characteristics, such as impedance matching characteristics and rise and fall time characteristics, over a range of PVT variations.

Figure 1:
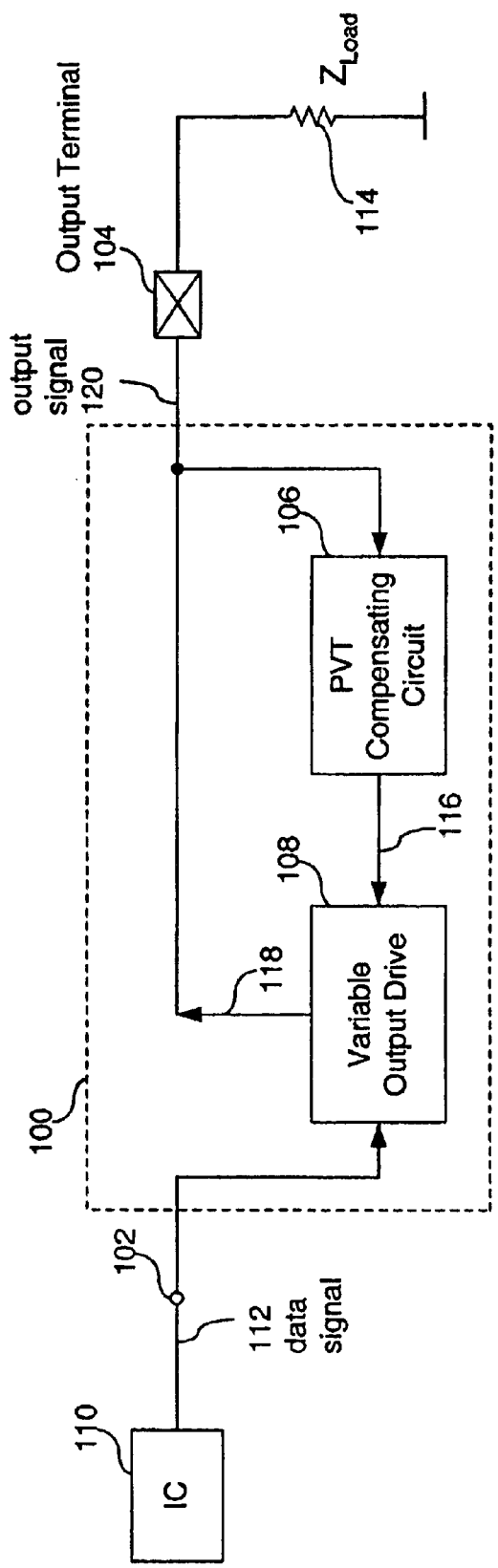
FIG. 1 is a high-level block diagram of an output circuit in accordance with an aspect of the present invention.

FIG. 1 is a high-level block diagram of an output circuit 100 in accordance with the present invention. The output circuit 100 includes a PVT compensating circuit 106 and a variable output drive 108. The output circuit 100 is coupled between an input terminal 102 and an output terminal 104. The input terminal 102 couples the output circuit 100 to an IC core 110. The IC core 110 can be any of a variety of types of integrated circuitry. The IC core 110 outputs a data signal 112, which is propagated through the output circuit 100 to the output terminal or pad 104. The output pad 104 is coupled to a load 114 having a load impedance.

The output circuit 100 further includes impedance matching circuitry (not shown in FIG. 1) that substantially matches the output impedance of circuit 100 to the load impedance. The impedance matching circuitry helps to insure that signal characteristics at the output terminal 104 are within a desired range. PVT variations, however, can affect the signal characteristics.

The PVT compensating circuit 106 monitors/senses an output signal 120 at the output terminal 104 for PVT variations. PVT variations can be due to PVT variations in the IC core 110, the output circuit 100, and/or the load 114. The PVT compensating circuit 106 outputs a control signal 116 that controls the variable output drive 108. The variable output drive 108 generates a compensation output signal 118, which compensates for detected PVT variations. In the example of FIG. 1, the compensation output signal 118 is provided directly to the output terminal 104. Alternatively, the compensation output signal 118 is provided to the output terminal 104 through an impedance resistance, as described below.

PVT variations can affect rise and fall times of the output signal 120. In an embodiment, the PVT compensating circuit 106 senses rising and falling edges of the output signal 120 at the output terminal 104, and controls the variable output drive 108 to compensate the rising and falling edges with additional drive as needed.

In an embodiment, the PVT compensating circuit 106 senses changes in voltage with respect to time ("dV/dt") and varies the control signal 116 in proportion to the rate of change (dV/dt). In an embodiment, the PVT compensating circuit 106 varies the control signal 116, and thus the variable output drive 108, inversely proportional to the dV/dt. In other words, at higher dV/dt, the variable output drive 108 provides little, if any, compensation. As the dV/dt decreases, the variable output drive 108 increases the compensation.

In an embodiment, when the output signal 120 at the output terminal 104 should be at steady state, the output circuit 100 provides no compensation. Alternatively, when the output signal should be at steady state, the output circuit 100 maintains a constant level of compensation.

FIG. 2 is a high-level block diagram of an output circuit 200 in accordance with an aspect of the present invention. The output circuit 200 is an example embodiment of the output circuit 100. The output circuit 200 includes the PVT compensating circuit 106 and the variable output drive 108. The output circuit 200 further includes a primary output drive 202, an impedance resistance 204, and an electrostatic discharge ("ESD") resistance 206. The primary drive 202 propagates the data signal 112 to the output terminal 104 through the impedance resistance 204. The PVT compensating circuit 106 monitors the output signal 120 at the output terminal 104, through the ESD resistance 206. In an embodiment, the ESD resistance 206 is part of an ESD circuit that protects the PVT compensating circuit 106 from ESD events that occur at the output terminal 104.

The PVT compensating circuit 106 monitors and/or senses one or more circuit and/or signal characteristics at the output terminal 104 and determines whether compensation is needed to correct for PVT variations in the IC core 110, the output circuit 200, and/or the load 114. For example, where the PVT compensating circuit 106 monitors changes in voltage with respect to time, the compensating circuit 106 determines whether the rate of change is within a desired or predetermined range. The PVT compensating circuit 106 generates the control signal 116 to increase, decrease, or maintain the rate of voltage change at the output terminal 104. The control signal 116 is provided to the variable output drive 108.

In an embodiment, the variable output drive 108 provides compensation to the output terminal 104 during state transitions of the output signal 120. In order to determine when state transitions occur, the variable output drive 108 also receives the data signal 112. The variable output drive 108 uses the data signal 112 as an enable signal to insure that the variable output drive 108 compensates during state transitions, as now described.

In FIG. 2, the variable output drive 108 includes a delay 208 that delays the data signal 112 by approximately the same amount of delay imparted on the data signal 112 as it is propagated from the IC core 110, to the output terminal 104, to the output of the PVT compensating circuit 106. The delay 208 allows the variable output drive 108 to determine whether the output signal 120, as viewed at the output terminal 104, is transitioning between states. When the signal at the output terminal 104 is transitioning between states, the variable output drive 108 is enabled to generate and/or adjust the compensation output signal 118. In an embodiment, the variable output drive 108 outputs the compensation output signal 118 to maintain, increase and/or decrease the rate of voltage change at the output terminal 104.

In an embodiment, the primary output drive 202 and the variable output drive 108 are current sources, which can be combined directly with one another.

II. Example Embodiments

FIG. 3A is a circuit diagram of an example output circuit 300 in accordance with an aspect of the present invention. The output circuit 300 is an example embodiment of the output circuit 200. The output circuit 300 includes a first set of compensation circuitry for compensating rising edges, generally denoted with the suffix "a" and a second set of compensation circuitry for compensating falling edges, generally denoted with the suffix "b."

In the output circuit 300, the primary output drive 202 includes primary output drives 202a and 202b, which drive positive and negative transitions (i.e., rising and falling edges), respectively. The primary output drive 202a is illustrated with an inverter 310a and one or more PMOS devices 312a. The primary output drive 202b is illustrated with an inverter 310b and one or more NMOS devices 312b. The invention is not, however, limited to this embodiment. Other embodiments utilize other types and/or numbers of devices.

In the output circuit 300, the PVT compensating circuit 106 includes a feedback circuit 302 coupled to the ESD resistance 206. The feedback circuit 302 receives the output signal 120 from the output pad 104 through the ESD resistance 206. Alternatively, the feedback circuit 302 includes an internal resistance in place of, or in addition to the ESD resistance 206. The feedback circuit 302 generates a signal 304 representative of voltage ("V") or changes in voltage with respect to time ("dV/dt"), as measured at the output pad 104. In an embodiment, the feedback circuit 302 includes a capacitance that, when combined with the resistance of the ESD resistance 206, generates the V or dV/dt signal 304. In series with the capacitor, the feedback circuit 302 includes an inverter.

Figure 4:
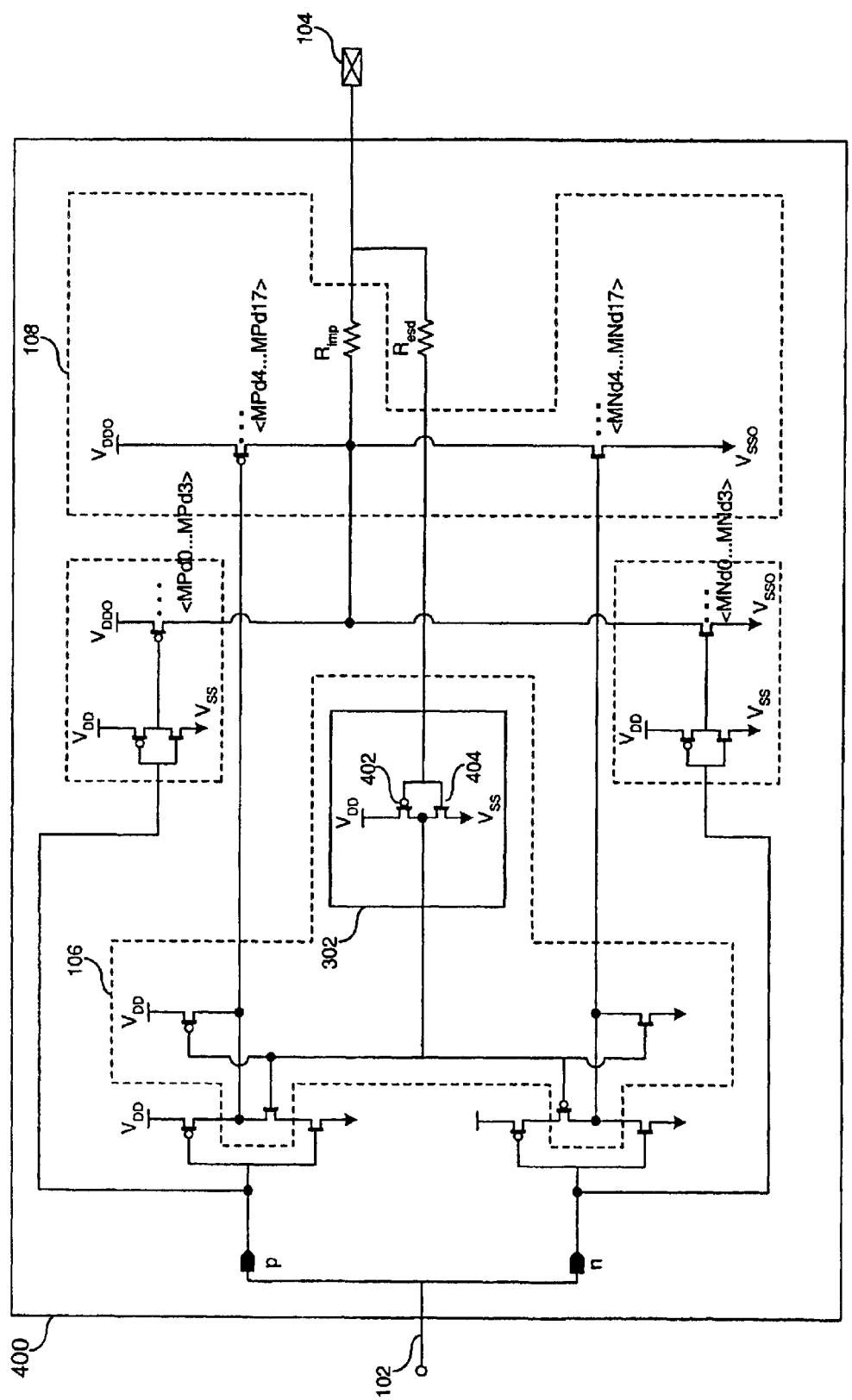
FIG. 4 is another circuit diagram of an example embodiment of the output circuit illustrated in FIG. 2.

The feedback circuit 302 can be implemented in a variety of ways. For example, in FIG. 4, the feedback circuit 302 is implemented as an inverter. In FIG. 5, the feedback circuit 302 is implemented as a cross-coupled pair. The cross-coupled pair of FIG. 5 works similar to the inverter of FIG. 4. In FIGS. 6, 7, and 8, the feedback circuit 302 is implemented as voltage comparator circuits. In the voltage comparator circuits of FIGS. 6 and 7, the voltage from the output pad 104 is compared to a reference voltage (V_ref). When V_pad>V_ref, the current drive of the output circuit is reduced. When V_pad<V_ref, the current drive of the output circuit is increased. Typically, V_ref is close to VDDO/2 and could be generated by using a resistive divider on VDDO (as shown in FIG. 8) or other supply voltage. Other similar circuitry such as a current comparator could also be used instead of the voltage comparator. The invention is not, however, limited to these exemplary embodiments. Based on the description herein, one skilled in the relevant art(s) will understand that other circuit implementations of the feedback circuit 302 are possible. Such other implementations are within the scope of the present invention.

Referring back to FIG. 3, the PVT compensating circuit 106 generates separate control signals 116a and 116b for controlling compensation to rising and falling edges, respectively. The PVT compensating circuit 106 generates the rising edge control signal 116a with PMOS device 308a and NMOS device 306a. The PMOS device 308a acts as an adjustable voltage source that outputs the control signal 116a under control of the V or dV/dt signal 304. The NMOS device 307a acts as an enabling device that enables the V or dV/dt signal 304 to control the NMOS device 306a during state transitions of the output signal 120, and essentially terminates the V or dV/dt signal 304 when the output signal 120 is below a pre-determined value. The PVT compensating circuit 106 generates the falling edge control signal 116b in a similar fashion, using an NMOS device 308b and a PMOS device 306b.

Figure 3:
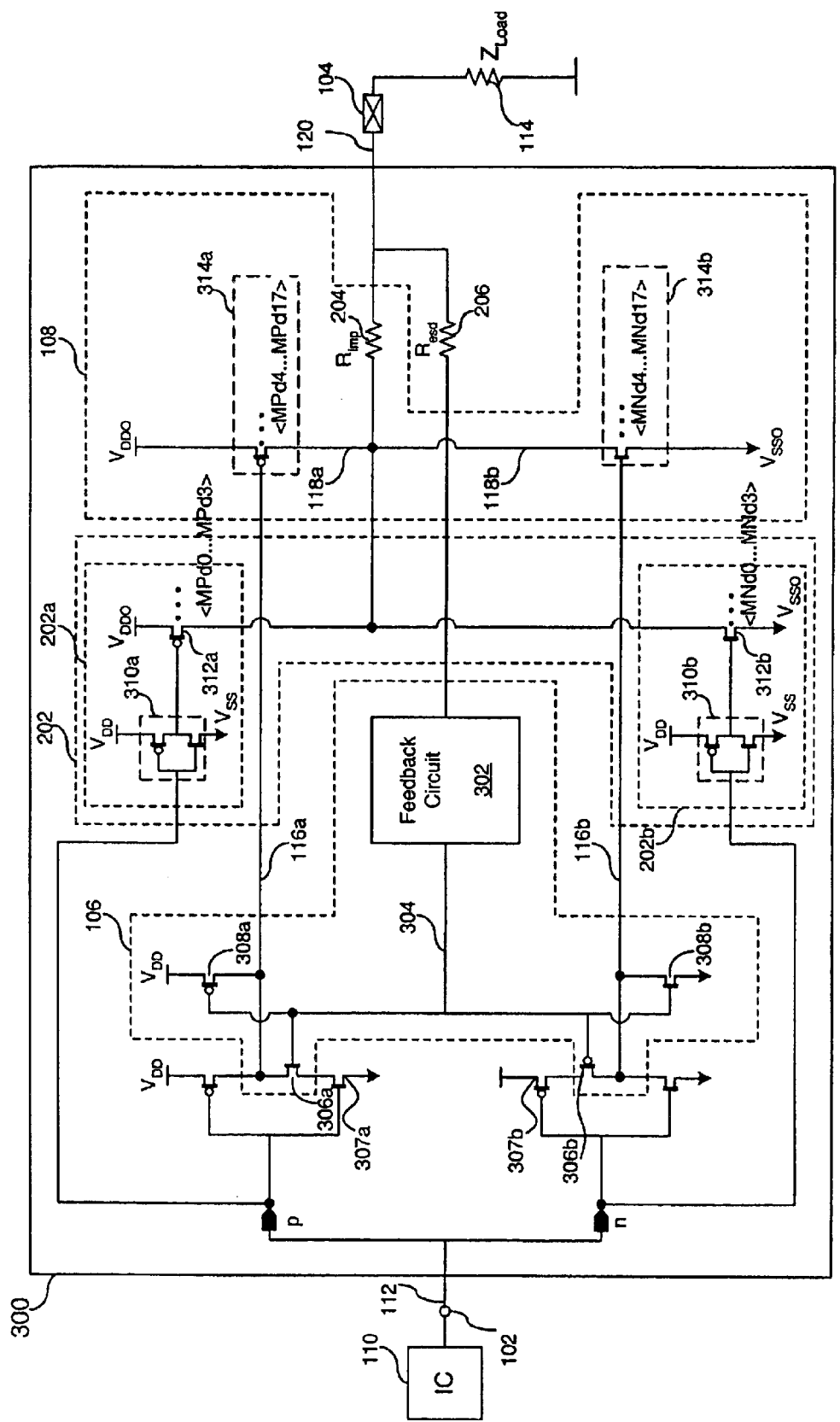
FIG. 3 is a circuit diagram of an example embodiment of the output circuit illustrated in FIG. 2.

In FIG. 3, the variable output drive 108 is illustrated with separate fingers for positive and negative transitions. Positive transitions are compensated with drive from a set of one or more PMOS devices 314a, under control of the control signal 116a. Negative transitions are compensated with drive from a set of one or more NMOS devices 314b, under control of the control signal 116b.

Impedance matching features of the invention are now described. In the primary output drive 202, the PMOS device(s) 312a and the NMOS device(s) 312b include inherent resistances and capacitances. Similarly, in the variable output drive 108, the PMOS device(s) 314a and the NMOS device(s) 314b include inherent resistances and capacitances. These inherent resistances and capacitances, together with the impedance resistance 204, form an output impedance. The PMOS devices 312a and 314a, the NMOS devices 312b and 314b, and the impedance resistance 204, are selected to provide an output impedance appropriate for a given load impedance.

In an embodiment, the impedance matching characteristics provided by the primary output drive 202 and the variable output drive 108 are relatively fixed without regard to the level of compensation provided by the variable output drive 108. Alternatively, under ideal or near-ideal circumstances (e.g., no PVT variations), when no compensation is required, the primary output drive 202 provides suitable impedance matching to the load 114. For non-ideal circumstances (e.g., PVT variations), the variable output drive 108 provides additional impedance matching characteristics. In an embodiment, the additional impedance matching characteristics of the variable output drive 108 vary in proportion to control signals 116a and 116b.

In operation, the output pad 104 is driven by fingers of devices 312a (e.g., MPd0–MPd3), 312b (e.g., MNd0–MNd3), 314a (e.g., MPd4–MPd17), and 314b (e.g., MNd4–MNd17). The value of the impedance resistance 204 (i.e., R_imp), is chosen such that the combination of the impedance resistor 204 and the inherent impedance of devices 312a, 312b, 314a, and 314b, match the impedance of the load 114. The voltage and dV/dt (change in voltage with time) at output pad 104 are fed-back to the PVT compensating circuit 106 after passing through the ESD resistance 206 (i.e., R_esd). The fed-back voltage and dV/dt are used to control the gate drives of the NMOS device 306a and the PMOS device 306b. The voltage level at the pad terminal and the rate of change of voltage at the pad terminal affects the switching-point of the input of the PVT compensating circuit 106.

The ESD resistor 206, along with input gate capacitance of the PVT compensating circuit 106, make the PVT compensating circuit sensitive to the dV/dt of the signal at the output pad 104. Thus, during rising transitions at the output pad 104, a high voltage at the output pad 104 and a high dV/dt causes the input of the PVT compensating circuit 106 (e.g., an inverter in FIG. 4), to be charged high fast causing the input NMOS device 404 to turn-on hard and fast, thereby quickly decreasing the gate voltage of the NMOS device 306a and PMOS device 308a to reduce the conduction of the NMOS device 306a and increase the conduction of the PMOS device 308a. This increases the voltage at 116a thereby reducing conduction of output PMOS 314a. Similarly, during falling transitions at the output pad 104, a low voltage at the output pad 104 and a high −dV/dt (high dV/dt in the negative direction), causes the PMOS device 402 to turn-on hard and fast, thereby quickly increasing the gate voltage of the PMOS device 306b and NMOS device 308b, to reduce the conduction of the PMOS device 306b and increase conduction of the NMOS device 308b. This decreases the voltage at 116b, thereby reducing conduction of output NMOS device 314b. The voltage at the output pad 104 generally depends on the relative values of the impedance of the load 114 and the output transistors plus any built-in-resistor impedance.

In FIGS. 3–8, the PMOS device 308a and the NMOS device 308b are controlled by a single feedback circuit 302. Alternatively, the PMOS device 308a and the NMOS device 308b can also be controlled with separate feedback circuits.

In an embodiment, multiple PVT compensating circuits having varying switching points are used to control different legs of output PMOS and NMOS devices, each output PMOS and NMOS device coupled to different variable output drive fingers. This provides, among other things, greater granularity of control.

III. Methods of Operation

In FIG. 9 illustrates a process flowchart 900 for implementing the present invention. For exemplary purposes, the process flowchart 900 is described below with reference to one or more of the example system implementations illustrated in one or more of the drawing FIGS. 1–8. The present invention is not, however, limited to the example system implementations illustrated in drawing FIGS. 1–8. Based on the description herein, one skilled in the relevant art(s) will understand that the process flowchart 900 can be implemented with other system implementations as well. Such other implementations are within the spirit and scope of the present invention.

The process begins with step 902, which includes receiving an output signal from a circuit. For example, in FIG. 1, the data signal 112 is received at the input terminal 102.

Step 904 includes propagating the output signal to an output terminal. For example, in FIG. 2, the data signal 112 is propagated to the output terminal 104 by the primary output drive 202.

Step 906 includes sensing changes in voltage level and change in voltage with respect to time at the output terminal. For example, in FIG. 2, the PVT compensating circuit 106 senses changes in voltage with respect to time at the output terminal 104.

Step 908 includes generating a control signal proportional to the sensed changes in voltage with respect to time. For example, in FIG. 2, the PVT compensating circuit 106 generates the control signal 116 proportional to the sensed changes in voltage with respect to time.

Step 910 includes generating a supplemental drive signal under control of the control signal. For example, in FIG. 2, the variable output drive 108 generates the supplemental drive signal 118 under control of the control signal 116.

Step 912 includes providing the supplemental drive signal to the output terminal, wherein the output signal at the output terminal has a rate of voltage change with respect to time that is substantially within a predetermined range. For example, in FIG. 2, the supplemental drive signal 118 is combined with the output of the primary output drive 202 and provided to the output terminal 104 through the impedance resistance 204. The supplemental drive signal 118 is generated so as to substantially maintain the rate of voltage change at pad terminal 104 with respect to time within a predetermined range.

Step 914 includes impedance matching the output signal and said supplemental output signal to the load. For example, in FIG. 3, in an embodiment described above, the primary output drive 202 and the variable output drive 108 include inherent gate resistances and capacitances that, in combination with the impedance resistance 204, substantially matches the impedance of the load 114.

In an embodiment, the control signal generated in step 908 is further used to control impedance matching characteristics. For example, in FIG. 3, in an embodiment, the inherent resistance of the variable output drive 108 varies in accordance with the control signal 116. As a result, the output signal 120 at the pad terminal 104 is substantially impedance matched to the load 114 for a range of process, voltage, and/or temperature variations in the circuits 110 and 300, and the load 114. Accordingly, FIG. 9 includes an optional step 916, which includes controlling the impedance matching with the control signal, wherein the output signal and the supplemental output signal are substantially impedance matched to the load for a range of process, voltage, and/or temperature variations in the circuit and the load.

IV. Conclusions

The present invention has been described above with the aid of functional building blocks illustrating the performance of specified functions and relationships thereof. The boundaries of these functional building blocks have been arbitrarily defined herein for the convenience of the description. Alternate boundaries can be defined so long as the specified functions and relationships thereof are appropriately performed. Any such alternate boundaries are thus within the scope and spirit of the claimed invention. One skilled in the art will recognize that these functional building blocks can be implemented by discrete components, application specific integrated circuits, processors executing appropriate software, and the like, and/or combinations thereof.

While various embodiments of the present invention have been described above, it should be understood that they have been presented by way of example only, and not limitation. Thus, the breadth and scope of the present invention should not be limited by any of the above-described exemplary embodiments, but should be defined only in accordance with the following claims and their equivalents.

What is claimed is:

1. A system for maintaining circuit and/or signal characteristics over a range of process, voltage, and/or temperature (PVT) variations in said circuit, comprising:
    an input terminal for receiving a data signal from said circuit;
    a compensating circuit coupled between said input terminal and an output terminal, said compensating circuit generating a control signal substantially proportional to sensed PVT variations in an output signal at said output terminal; and
    a variable output drive coupled to receive said data signal and said control signal, said variable output drive generating a compensation output signal to provide compensation to said output terminal according to said control signal, said compensation output signal maintaining said circuit and/or signal characteristics over said range of PVT variations.

2. The system according to claim 1, wherein said variable output drive includes a delay to provide compensation to said output terminal during state transitions of said output signal at said output terminal.

3. The system according to claim 2, wherein said delay is substantially equal to a propagation delay of said data signal from said circuit, to said output terminal, to the output of said compensating circuit.

4. The system according to claim 1, wherein said compensating circuit senses a rate of voltage change and proportionally varies said control signal according to said sensed rate of voltage change.

5. The system according to claim 4, wherein said variable output drive generates said compensation output signal to maintain, increase, and/or decrease said rate of voltage change at said output terminal.

6. An output circuit for adjusting rise and/or fall times of an output signal, according to sensed process, voltage, and/or temperature (PVT) variations, comprising:
    a compensating circuit including:
        a feedback circuit coupled to receive said output signal from an output terminal, said feedback circuit generating a feedback signal representative of said sensed PVT variations;

a first PMOS device and a first NMOS device both coupled to receive said feedback signal, said first PMOS device and said first NMOS device generating a rising edge control signal according to said feedback signal; and a second PMOS device and a second NMOS device both coupled to receive said feedback signal, said second PMOS device and said second NMOS device generating a falling edge control signal according to said feedback signal; and a variable output drive coupled to receive an input signal from a circuit, said variable output drive including:

one or more output PMOS devices coupled to receive said rising edge control signal to compensate positive transitions of said output signal; and one or more output NMOS devices coupled to receive said falling edge control signal to compensate negative transitions of said output signal.

7. The output circuit according to claim 6, wherein said compensating circuit further comprises a second feedback circuit generating a second feedback signal, said second PMOS device and said second NMOS device both coupled to receive said second feedback signal.

8. The output circuit according to claim 6, wherein said feedback signal is representative of voltage sensed at said output terminal.

9. The output circuit according to claim 6, wherein said feedback signal is representative of the rate of voltage change sensed at said output terminal.

10. The output circuit according to claim 6, comprising a plurality of compensating circuits that control different legs of said one or more output PMOS and NMOS devices, each of said one or more output PMOS and NMOS devices coupled to different fingers of said variable output drive.

* * * * *